(12) United States Patent
Robinson

(10) Patent No.: US 10,114,100 B2
(45) Date of Patent: Oct. 30, 2018

(54) METHOD FOR MAGNETIC RESONANCE IMAGING

(71) Applicant: Medizinische Universität Wien, Vienna (AT)

(72) Inventor: Simon Daniel Robinson, Vienna (AT)

(73) Assignee: Medizinische Universität Wien, Vienna (AT)

(*) Notice: Subject to any disclaimer, the term of this patent is extended or adjusted under 35 U.S.C. 154(b) by 302 days.

(21) Appl. No.: 15/150,915

(22) Filed: May 10, 2016

(65) Prior Publication Data

US 2016/0334492 A1 Nov. 17, 2016

(30) Foreign Application Priority Data

May 13, 2015 (EP) .................................... 15167569

(51) Int. Cl.
*G01R 33/565* (2006.01)
*G01R 33/3415* (2006.01)
*G01R 33/56* (2006.01)

(52) U.S. Cl.
CPC ... *G01R 33/56545* (2013.01); *G01R 33/3415* (2013.01); *G01R 33/5608* (2013.01); *G01R 33/56536* (2013.01); *G01R 33/56563* (2013.01)

(58) Field of Classification Search
CPC ............ G01R 33/3415; G01R 33/5608; G01R 33/56536; G01R 33/56545; G01R 33/56563; G01R 33/565

(Continued)

(56) References Cited

U.S. PATENT DOCUMENTS 6,483,308 B1 11/2002 Ma et al.
6,542,767 B1* 4/2003 McNichols .......... A61B 5/0008
600/407

(Continued)

FOREIGN PATENT DOCUMENTS

EP 1310211 A1 5/2003

OTHER PUBLICATIONS

Louise van der Weerd, et al., Evaluation of algorithms for analysis of NMR relaxation delay curves, Mag. Resonance Imaging 18 at 1151-1157 (Elsevier 2000).*

(Continued)

*Primary Examiner* — Tung X Nguyen
*Assistant Examiner* — Robert P Alejnikov, Jr.
(74) *Attorney, Agent, or Firm* — Hoffmann and Baron, LLP; Glenn Henneberger

(57) ABSTRACT

The present invention relates to a method for Magnetic Resonance Imaging to depict an object by an image having pixels representing volume element of the object. The method comprises: Immobilizing the object and acquiring a reference image at a first echo time immediately following an excitation, wherein said reference image is complex-valued, with a reference magnitude value and a reference phase value for each pixel; acquiring a target image of the object with said receiver coil at a pre-selected second echo time, wherein said target image is complex-valued, with a target magnitude value and a target phase value for each pixel; subtracting, pixel by pixel, the reference phase value from the target phase value to obtain a corrected phase value for each pixel; and obtaining said image from said target magnitude values and said corrected phase values.

17 Claims, 3 Drawing Sheets

(58) Field of Classification Search
USPC .................... 324/300–322; 600/407–435; 382/128–131
See application file for complete search history.

(56) References Cited

U.S. PATENT DOCUMENTS

| | | | | |
|---|---|---|---|---|
| 7,359,745 | B2* | 4/2008 | Lewin | G01R 33/022 |
| | | | | 324/312 |
| 7,505,805 | B2* | 3/2009 | Kuroda | G01R 33/4804 |
| | | | | 324/315 |
| 8,030,922 | B2* | 10/2011 | Roland | G01R 33/56563 |
| | | | | 324/309 |
| 2012/0321162 | A1 | 12/2012 | Liu et al. | |

OTHER PUBLICATIONS

EPO Search Report for Application No. 15167569.1-1560 dated Oct. 28, 2015.
"Evaluation of algorithms for analysis of NMR relaxation decay curves," van der Weerd, et al., Magnetic Resonance Imaging 18 (2000), pp. 1151-1157.
"Coil Combination Method for Multiple-Echo Sequences and PSF Mapping," Zhou, et al., Proc. Intl. Soc. Mag. Reson. Med. 17 (2009), p. 2777.
"Combining Phase Images From Multi-Channel RF Coils Using 3D Phase Offset Maps Derived from a Dual-Echo Scan," Robinson, et al., Magnetic Resonance in Medicine 65:1638-1648 (2011).
"Gradient Echo Plural Contrast Imaging—Signal model and derived contrasts: T2*, TI, Phase, SWI, TIF, FST2* and T2*-SWI," Luo, et al., NeuroImage 60 (2012), pp. 1073-1082.
"Phase-preserving multi-coil combination with improved intensity modulation," Newbould, et al., Proc. Intl. Soc. Mag. Reson.Med. 16 (2008), p. 1280.
"Combining Phased array data using Offsets from a Short Echo-time Reference scan (COMPOSER)," Robinson, et al., Proc. Intl. Soc. Mag. Reason. Med. 23 (2015), p. 3308.
"Development of a robust method for generating 7.0 T multichannel phase images of the brain with application to normal volunteers and patents with neurological diseases," Hammond, et al., NeuroImage 39 (2008), pp. 1682-1692.
"The NMR Phased Array," Roemer, et al., Magnetic Resonance in Medicine 16, pp. 192-225, (1990).

* cited by examiner (State of the Art)

METHOD FOR MAGNETIC RESONANCE IMAGING

CROSS-REFERENCE TO RELATED APPLICATION(S)

This application claims priority to European Patent Application No. 15 167 569.1, filed May 13, 2015, the disclosure of which is herein incorporated by reference in its entirety.

FIELD OF THE INVENTION

The present invention relates to a method for Magnetic Resonance Imaging (MRI) to depict a 3-dimensional object by an image having pixels representing volume elements of the object.

BACKGROUND

MRI is used in radiology to visualize details of structures in a patient's body. For aligning the magnetic spin of the nuclei, mostly of protons in water molecules in the body tissue, the patient is placed inside a powerful static magnetic field. Excited by an electro-magnetic radio-frequency pulse from a transmitter coil the nuclei resonating at this frequency deflect and then gradually relax towards the static field while emitting detectable electro-magnetic radiation, which can be captured as an "echo" at a certain time after excitation (the "echo time") by a receiver coil. Relaxation times and the resonance frequency of the nuclei depend both on local properties of the tissue material, which represents the underlying principle allowing visualization of these properties. The characteristics of the image are also influenced by proton density and magnetic field strength. By superposing lateral and longitudinal gradient fields and adjusting the excitation frequency, certain volumetric regions ("volume elements") can be measured by both selective excitation and frequency analysis of the captured echo signals. Fourier-transforming the latter generates complex representations of the frequency values and their phases, which can be made readable.

When the excitation is performed on 2-dimensional slices through the object, they are selected by adjusting the gradients in the magnetic field strength, thereafter resonant frequency values are captured and processed, forming 2-dimensional images, a number of which can be merged to form a 3-dimensional representation of the object. Alternatively, in 3-dimensional imaging, a large volume of tissue is excited and spatially encoded using frequency encoding in one direction and phase encoding in both of the remaining two orthogonal directions.

In the past, magnitude values have been used primarily from the complex representations. Nevertheless, phase values allow for the extraction of additional information about local properties inside the tissue, where they specifically benefit from strong susceptibility effects at high magnetic field strengths. For example, phase information is used in neuroimaging in phase-contrast angiography, Susceptibility-Weighted Imaging (SWI), susceptibility mapping—also known as Quantitative Susceptibility Mapping (QSM), Susceptibility Tensor Imaging, to depict iron accumulation in neurodegenerative disorders and to map in vivo conductivity. It can also be used to monitor temperature and encode flow velocity.

However, each phase value acquired by a receiver coil of the MRI machine is subject to a time-independent offset, often referred to as "phase offset". The phase offset comprises spatially constant components, e.g. due to the cable length from a receiver coil to a receiver, as well as spatially variable components, e.g. due to the path lengths of the excitation and echo signals from particular locations in the object to the receiver coil in question, reflecting inhomogeneities in the magnetic field.

It has been an aim of research to eliminate the effects of the phase offset, e.g. in order to facilitate combining multiple phase images acquired with a plurality of receiver coils arranged in an array around the object, and thereby increase the quality of an acquired image in terms of its signal-to-noise ratio. Several approaches have been presented in the past: One of these approaches, presented by Hammond, K. E. et al., "Development of a robust method for generating 7.0 T multichannel phase images of the brain with application to normal volunteers and patients with neurological diseases", NeuroImage 2008, 39; pp. 1682-1692, suggests to estimate a spatially constant phase offset by setting the phase values to zero in all coils at the centre of an image. This method, while being easy to apply, results in areas of poor phase matching. An alternative solution is to refer the phase values of each receiver coil to a "virtual reference coil" which is the result of a two-step procedure. In the first step, a combined image (the Virtual Reference Coil, or VRC, image) is generated using an image-based constant (as in the method of Hammond et al.). In the second step, the phase image from each coil is referenced to the VRC image. While the matching of phase values of different receiver coils is very good in this case, local field variations arising from magnetic susceptibility are not reflected. Yet another solution, proposed by Roemer, P. B. et al., "The NMR phased array", Magn Reson Med 1990, 16; pp. 192-225, uses an additional body coil or other homogeneous volume reference coil—i.e. a coil which is separate from said receiver coils and has to be sensitive over (at least) all the tissue over which the receiver coils, arranged in an array around the object, are sensitive—for referencing and using a phase offset separately measured by means of the body coil for each receiver coil; however, such an additional body coil is not commonly available in ultra-high field scanners and requires extra space and control.

SUMMARY

It is an object of the present invention to provide a method for magnetic resonance imaging which does not rely on an additional volume coil (e.g. body coil) or coarse estimations and yields an accurate image of an object at low computing time.

This object is achieved with a method for Magnetic Resonance Imaging to depict a 3-dimensional object by an image having pixels representing volume elements of the object, comprising: immobilising the object and acquiring a reference image of the object with a receiver coil at a first echo time immediately following an excitation by a transmitter coil, wherein said reference image is complex-valued, representing each volume element by a pixel with a reference magnitude value and a reference phase value; keeping the object immobilised and acquiring a target image of the object with said receiver coil at a pre-selected second echo time, significantly longer than said first echo time, following the same or another excitation by said transmitter coil, wherein said target image is complex-valued, representing each volume element by a pixel with a target magnitude value and a target phase value; subtracting, pixel by pixel, the reference phase value from the target phase value to obtain a corrected phase value for each pixel; and obtaining said image from said target magnitude values and said corrected phase values.

The method of the invention is particularly efficient and easy to implement, without requiring a volume reference coil (e.g. body coil), and accurate in the resulting image. An image obtained by the method is virtually without phase offset and can therefore be compared to or combined with other images obtained likewise from the same object using other receiver coils. The excitation can either be a single excitation pulse or a series of pulses which can be generated either from a single transmitter coil or an array of transmitter coils ("parallel transmit"). Thereby, the present method can be applied when parallel imaging is used to increase the signal-to-noise ratio and/or to reduce the acquisition time with a plurality of receiver coils arranged as phased array coil elements around the object. The method can be combined with image reconstruction techniques both in the image domain, i.e. after Fourier-transformation, and in the frequency domain, i.e. before Fourier-transformation, and is specifically beneficial for MRI at high magnetic field strengths.

In a preferred embodiment of the invention said first echo time is less than 1 ms. Thereby, there is very little reduction in the contrast in the image relating to magnetic susceptibility effects. It is specifically preferred when said first echo time is less than 100 μs. This leads to an even better correction of the phase offset.

To save time during acquisition, it is further preferred that the reference image is acquired at a lower pixel resolution than the target image and, prior to said subtracting, is upscaled to the pixel resolution of the target image. Saving time during acquisition of the reference image is particularly desirable to keep the examination time and the discomfort of immobilisation short for the patient.

According to a particularly favourable embodiment, the method is applied to each of a plurality of receiver coils arranged around said immobilised object to obtain a respective plurality of said images, followed by the step of calculating a combined phase image, pixel by pixel, according to $$\vartheta_S = \angle\left(\sum_p m_{T,p} \cdot e^{-i(\vartheta_{T,p}-\vartheta_{R,p})}\right)$$

with

∠(•) denoting the four-quadrant tangent inverse operator, $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{R,p}$ being the reference phase value of a pixel, representing said volume element, in a reference image acquired with the $p^{th}$ receiver coil, and $\vartheta_S$ being the phase value of a pixel, representing said volume element, in the combined phase image.

By applying the method to a plurality of receiver coils accordingly, the resulting offset-compensated images can be easily combined to obtain the combined phase image for further processing or evaluation. The combined phase image is more accurate and robust and the phase values thereof represent the phase values of the volume elements of the object better than an image from a single receiver coil would generally do. If desired, the combined phase image can subsequently be unwrapped.

Similarly, it is advantageous when the method is applied to each of a plurality of receiver coils arranged around said immobilised object to obtain a respective plurality of said images, followed by the step of calculating a combined magnitude image, pixel by pixel, according to $$m_S = \left|\sum_p m_{T,p} \cdot e^{-i(\vartheta_{T,p}-\vartheta_{R,p})}\right|$$

with

|•| denoting the magnitude operator, $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{R,p}$ being the reference phase value of a pixel, representing said volume element, in a reference image acquired with the $p^{th}$ receiver coil, and $m_S$ being the magnitude value of a pixel, representing said volume element, in the combined magnitude image.

Thereby, random background noise is eliminated or at least significantly reduced; consequently, the signal-to-noise ratio of the combined magnetic image is considerably increased as compared to the signal-to-noise ratio of a single one of the images.

In an additional or alternative embodiment, the method is advantageously applied to each of a plurality of receiver coils arranged around said immobilised object to obtain a respective plurality of said images, followed by the step of calculating a combined magnitude image, pixel by pixel, according to $$m_W = \sqrt{\left|\sum_p m_{T,p}^2 \cdot e^{-i(\vartheta_{T,p}-\vartheta_{R,p})}\right|}$$

with

|•| denoting the magnitude operator, $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{R,p}$ being the reference phase value of a pixel, representing said volume element, in a reference image acquired with the $p^{th}$ receiver coil, and $m_W$ being the magnitude value of a pixel, representing said volume element, in the combined magnitude image.

Likewise, this results in an effective reduction of background noise; moreover, by introducing a weighting by the magnitude values and applying a root-sum of squares thereto the resulting signal-to-noise ratio in the combined image is particularly high. For decreasing the acquisition and examination time, it is favourable when the respective reference or target images acquired with said plurality of receiver coils are all acquired following one and the same excitation.

BRIEF DESCRIPTION OF THE DRAWINGS

The invention will now be described in further details by means of exemplary embodiments thereof under reference to the enclosed drawings, in which.

DETAILED DESCRIPTION

Figure 1:
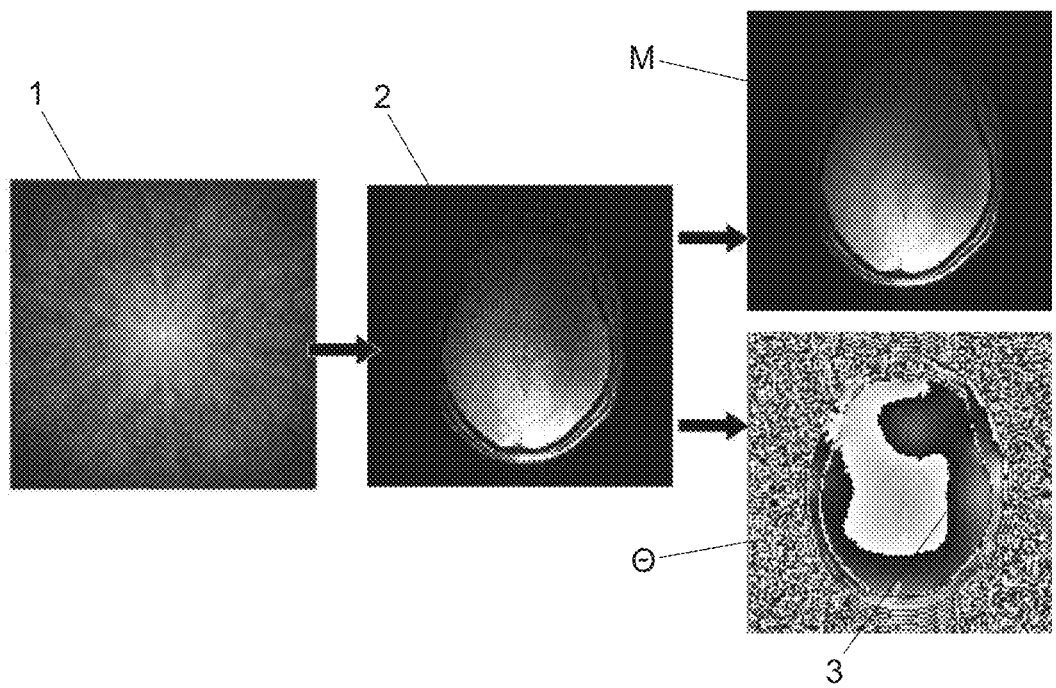
FIG. 1 shows the generation of a complex-valued image in Magnetic Resonance Imaging according to the state of the art.

Magnetic Resonance Imaging (MRI) is used in radiology to visualize soft tissues, non-invasively and in vivo. The process of generating an image of a patient usually consists of the following steps: creating a bulk (longitudinal) magnetisation in the tissue by placing and immobilising the patient inside a powerful static magnetic field; creating regional variation in this magnetic field, and thereby in the resonant frequency and phase of the nuclei, with three comparatively small, linear perpendicular magnetic fields ("gradients"); disturbing the magnetisation with one or more pulses of radio-frequency (RF) electromagnetic radiation ("excitation") applied at the resonant frequency by one or more transmitter coils, tipping the magnetisation into the transverse plane (which is perpendicular to the static magnetic field); and acquiring the RF signals emitted by the tissues as the magnetisation relaxes to the longitudinal direction, by one or more receiver coils.

In 2-dimensional tomographic imaging, space encoding of the signal works as follows. The first gradient field ("slice select") is applied during RF excitation, so that only spins in a narrow section of tissue are excited. The second ("readout") is applied while the signal is being acquired, so that spins along the readout axis are encoded by their resonant frequency. A number of such excitation-readout steps are acquired with differing applications of the third ("phase-encode") gradient, which encodes the signal along that gradient direction according to a dephasing rate. In 3-dimensional imaging, slice encoding is replaced by a second loop of phase-encoding steps in the slice gradient direction.

The RF signals emitted by the patient are captured as "echoes" at a certain time after excitation, by one or more receiver coils. Fourier-transforming the acquired MR-signals generates images of the patient, which consist of a large number of pixels representing volume elements, reflecting the local proton density and magnetic properties of the tissue. The acquired MR signals are complex-valued; images of the patient, as the Fourier-transform of the acquired signal, are therefore likewise complex-valued. That is, image signals consist of a magnitude value and a phase value and can be represented in conventional complex number notation.

Some MRI methods use only the magnitude of the MR-signal. Nevertheless, the phase value contains additional information, which can be clinically useful. While the magnitude value of the signal decays exponentially with echo time, the phase value evolves linearly, and reflects local deviation from the main magnetic field strength. The sensitivity of phase to local magnetic field also allows local iron (which is highly paramagnetic) to be imaged. Phase values can be used, in combination with magnitude values, e.g. to depict veins, due to the iron content of the deoxyhemoglobin iron, in a technique known as Susceptibility-Weighted Imaging. These techniques benefit from high static magnetic field, which provides enhanced magnetic susceptibility effects and higher quality images due to increased signal-to-noise ratio (SNR).

As shown in FIG. 1, captured signals of an acquired complex-valued signal image 1 of an object to be investigated cannot be interpreted straightforwardly. Fourier-transforming image 1 results in a complex-valued image 2 which can be separated on a pixel-by-pixel basis into a magnitude image M and a phase image $\Theta$.

However, the phase image $\Theta$ suffers from a conceptual ambiguity: As adding $2\pi$ to the phase of a signal results in the same measured phase value, the encoding range in captured phase values is effectively limited to $2\pi$ radians. Variations in phase values of an object when passing through $2\pi$ lead to discontinuities in the phase image $\Theta$ known as "phase wraps" 3, which distort the readability and obscure interesting phase features. Different algorithms are known in the art to remove such phase wraps 3 from a phase image $\Theta$.

Moreover, the phase values of the phase image $\Theta$ contain a time-independent phase offset, which, inter alia, depends on the position of the receiver coil of the MRI machine relative to the object to be examined and, to a certain extent, on the individual volume element to be examined. Phase images acquired by different receiver coils which generally are arranged as phased array coil elements around the 3-dimensional object can therefore not be combined with ease.

Figure 3:
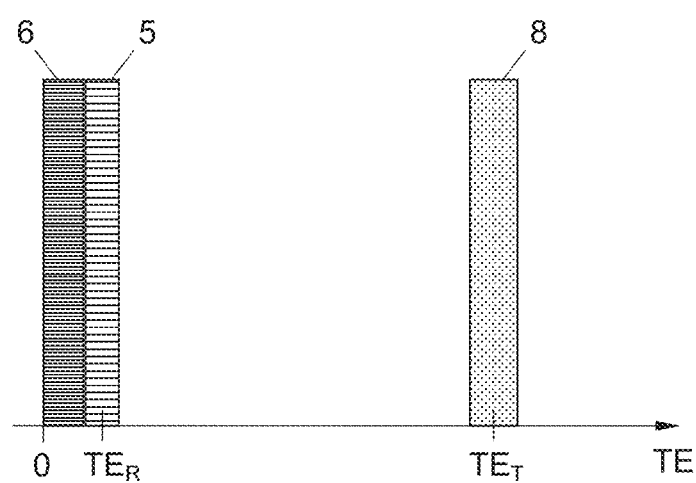
FIG. 3 depicts a timing diagram of an exemplary acquisition cycle used in the method of FIG. 2.
Figure 2:
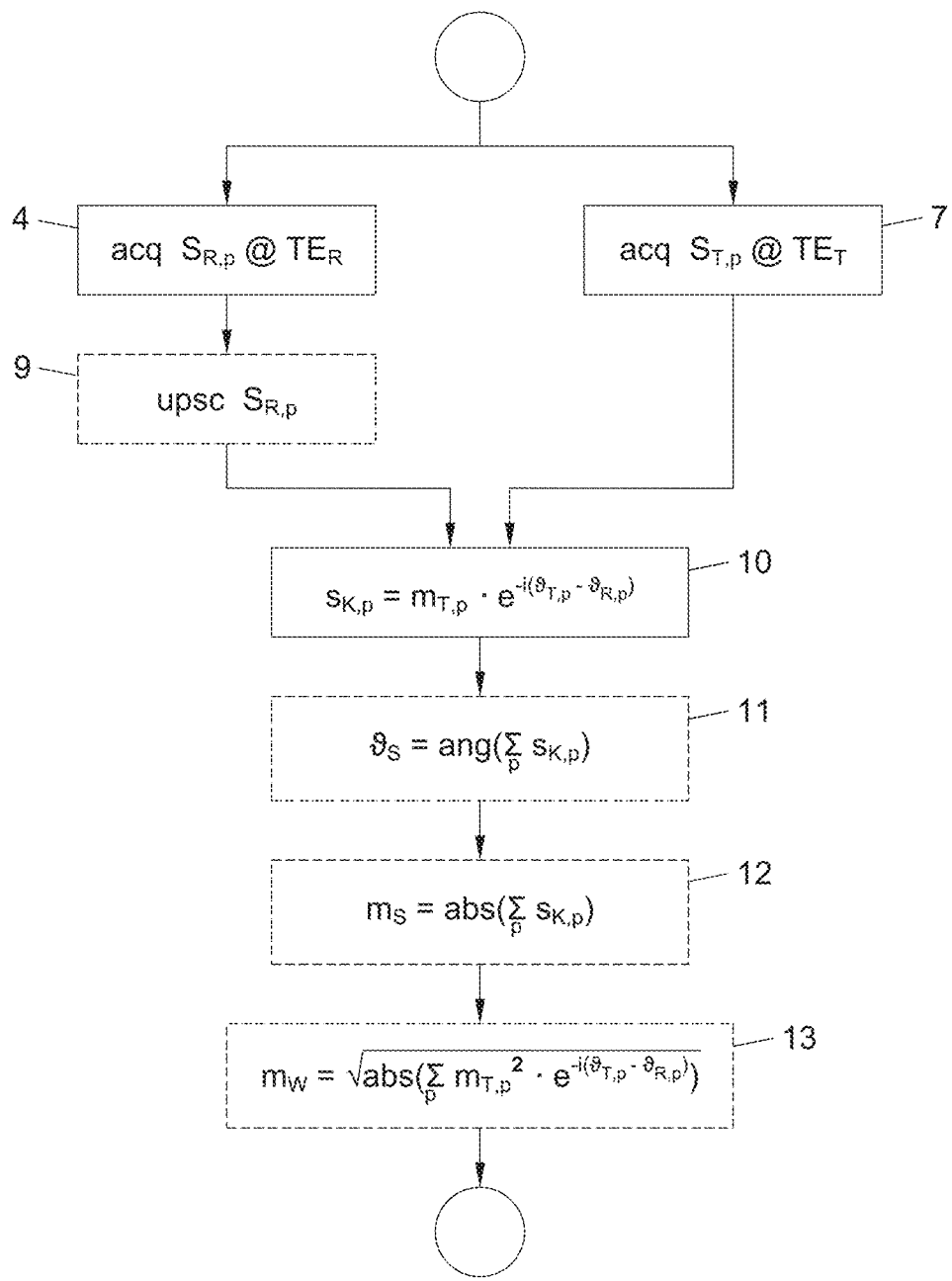
FIG. 2 shows a flow chart of different embodiments of the method of the invention for Magnetic Resonance Imaging.

With reference to FIGS. 2 to 4, different embodiments of a method for MRI accommodating these phase offsets shall now be described.

According to FIG. 2 in a first step 4 of said method a first or reference image $S_R$ of the object, here: the reference image $S_{R,p}$ of an exemplary receiver coil from a multitude of receiver coils—with indices p=1, 2, 3, . . . —of the MRI machine (see FIG. 4a), is acquired at a first or reference echo time $TE_R$ (FIG. 3). Said reference echo time $TE_R$ immediately follows the respective excitation of the object by the transmitter coil of the MRI machine. In fact, said reference echo time $TE_R$ may be the shortest echo time selectable for said receiver coil; it can be less than 1 ms or even less than 100 µs. The shortest echo time selectable, inter alia, depends on the MRI machine and the measurement sequence applied, e.g. on the sequence for space encoding, or on whether or not the receiver coil is also used as a transmitter coil, etc.

As can be seen from the schematic representation of FIG. 3, acquiring each reference image $S_R$ or $S_{R,p}$, respectively, takes a certain, finite acquisition period 5; similarly, the excitation is conducted by a pulse 6 of finite length. The excitation could alternatively be conducted by a predefined series of pulses, each pulse 6 for acquiring one or more volume elements step-by-step. Any excitation, whether a single pulse or a series of pulses, may be generated by a single or a plurality of transmitter coils, as known in the art.

Figure 4A:
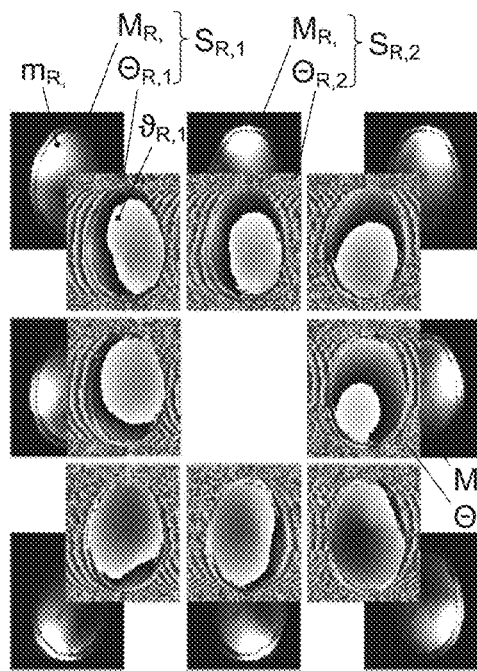
FIGS. 4a to 4d depict exemplary reference (FIG. 4a) and target images (FIG. 4b) acquired and complex-valued images (FIG. 4c) obtained according to the method of FIG. 2, and a magnitude image and phase image (FIG. 4d) calculated according to the method of FIG. 2.

As shown in FIG. 4a, said reference images $S_{R,1}$, $S_{R,2}$, . . . , $S_{R,p}$ are—as a Fourier-transformation of complex measured data—complex-valued, similarly to the image 2 of FIG. 1. Each of the complex-valued reference images $S_{R,p}$ can therefore be separated into a reference magnitude image $M_{R,p}$ and a reference phase image $\Theta_{R,p}$, in which the volume elements of the object are represented by complex-valued pixels comprising each a reference magnitude value $m_{R,p}$ and a reference phase value $\vartheta_{R,p}$, respectively (shown without index for the respective pixel in FIG. 4a).

The phase value $\vartheta_{R,p}$ acquired in a receiver coil at an echo time $TE_R$ depends both on the local deviation from the static magnetic field $\Delta B_0$ and the phase offset $\vartheta_{o,p}$ for that receiver coil according to $\vartheta_{R,p}=2\pi\gamma\cdot\Delta B_0\cdot TE_R+\vartheta_{o,p}$ (neglecting phase wraps.) Hence, in the limit $TE_R\to 0$, a phase value $\vartheta_{R,p}$ approximates the phase offset $\vartheta_{o,p}$.

Figure 4B:
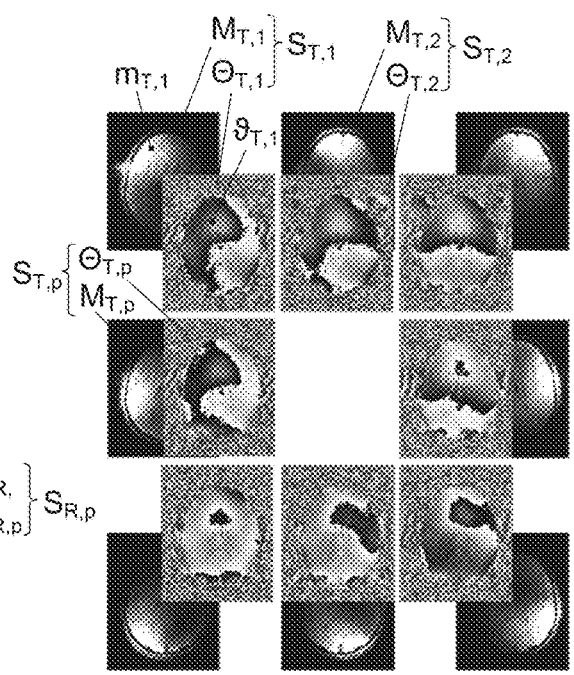

Reverting to FIG. 2, in a step 7—which can be performed using the same excitation pulse 6 or pulses as in step 4, or using a different excitation pulse 6 or pulses—a second or "target" image $S_T$ of the object (here: the target image $S_{T,p}$ of the receiver coil with index p, see FIG. 4b), is acquired at a pre-selected second or "target" echo time $TE_T$ over a finite acquisition period 8 (FIG. 3), while keeping the object immobilised with respect to step 4. The target echo time $TE_T$ is usually significantly longer than said reference echo time $TE_R$.

The reference echo time $TE_R$ and/or the target echo time $TE_T$ may follow the same excitation for a multitude of receiver coils; alternatively, for each receiver coil different reference and/or target echo times $TE_{R,p}$, $TE_{T,p}$, following the same or a separate excitation for each coil could be used.

The target images $S_{T,p}$ are complex-valued, representing the volume elements of the object selected by pixels comprising each a target magnitude value $m_{T,p}$ and a target phase value $\vartheta_{T,p}$, respectively (pixel index not shown in FIG. 4b).

As shown in FIGS. 4a and 4b, both the reference images $S_{R,p}$ and the target images $S_{T,p}$ can be separated into reference magnitude images $M_{R,p}$ and reference phase images $\Theta_{R,p}$, as well as target magnitude images $M_{T,p}$ and target phase images $\Theta_{T,p}$, respectively.

According to an optional embodiment of the method, in step 4 the reference images $S_{R,p}$ may be acquired at a lower pixel resolution than the target images $S_{T,p}$ in step 7. In this case, the reference images $S_{R,p}$ are each upscaled in a step 9 to the pixel resolution of the respective target image $S_{T,p}$. Such an upscaling step 9 can be based on generally known numeric algorithms for interpolation and/or extrapolation.

In a step 10 following the steps 4 and 7 (and step 9, where applicable) the reference phase values $\vartheta_{R,p}$ of a reference image $S_{R,p}$ are subtracted from the target phase values $\vartheta_{T,p}$ of the respective target image $S_{T,p}$, pixel by pixel, to obtain a corrected phase value $\vartheta_{K,p}$ for each pixel, and a complex-valued image $S_{K,p}$ is composed from said target magnitude values $m_{T,p}$ and said corrected phase values $\vartheta_{K,p}$, e.g. according to $$s_{K,p}=m_{T,p}\cdot e^{-i(\vartheta_{T,p}-\vartheta_{R,p})}=m_{T,p}\cdot e^{-i(\vartheta_{K,p})} \quad (eq.\ 1)$$

with $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{R,p}$ being the reference phase value of a pixel, representing said volume element, in a reference image acquired with the $p^{th}$ receiver coil, $\vartheta_{K,p}$ being the corrected phase value of a pixel, representing said volume element, in the image $S_{K,p}$ acquired the $p^{th}$ receiver coil, and $s_{K,p}$ being the complex value of said pixel in the image $S_{K,p}$.

Figure 4C:
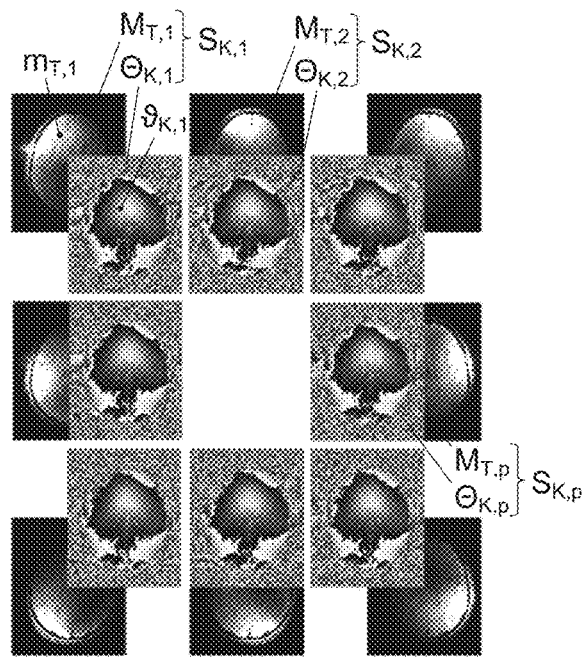

As shown in FIGS. 4a to 4c, method steps 4, (9), 7 and described so far are applied to each of a plurality of receiver coils in the same way, yielding a respective plurality of said images $S_{K,p}$. The images $S_{K,p}$ may each be separated into a target magnitude image $M_{T,p}$ and a corrected phase image $\Theta_{K,p}$, which are formed of the target magnitude values $m_{T,p}$ and the corrected phase values $\vartheta_{K,p}$, respectively, and which could be evaluated separately. In a preferred embodiment of the method, however, the target magnitude images $M_{T,p}$ and corrected phase images $\Theta_{K,p}$ acquired with different receiver coils are evaluated in combination, as will now be detailed in the following.

In a first variant, a combined phase image $\Theta_S$ can be calculated, pixel by pixel, in a following (optional) step 11 according to $$\vartheta_S = \angle \sum_p m_{T,p}\cdot e^{-i(\vartheta_{T,p}-\vartheta_{R,p})} \quad (eq.\ 2)$$

with $\angle(\bullet)$ denoting an angle operator, which, e.g., can be implemented as a four-quadrant tangent inverse operation (generally known as "a tan 2"-function in trigonometry), and $\vartheta_S$ being the phase value of a pixel, representing a respective volume element, in the combined phase image $\Theta_S$.

Alternatively or in addition thereto, in an optional step 12, which may be executed prior to, in parallel with, or after step 11, a combined magnitude image $M_S$ can be calculated, pixel by pixel, according to:

$$m_S = \left|\sum_p m_{T,p}\cdot e^{-i(\vartheta_{T,p}-\vartheta_{R,p})}\right| \quad (eq.\ 3)$$

and/or, see optional step 13 in FIG. 2, according to:

$$m_W = \sqrt{\left|\sum_p m_{T,p}^2\cdot e^{-i(\vartheta_{T,p}-\vartheta_{R,p})}\right|} \quad (eq.\ 4)$$

with $|\bullet|$ denoting the magnitude operator (generally known from absolute value operations), $m_S$ being the magnitude value of a pixel, representing a respective volume element, in the combined magnitude image $M_S$, and $m_W$ being the magnitude value, based on a root-sum of squares calculation in eq. 4, of a pixel, representing a respective volume element, in the combined magnitude image $M_S$.

Step 13, when applied, can be executed prior to, in parallel with, or after step 11 and step 12.

Figure 4D:
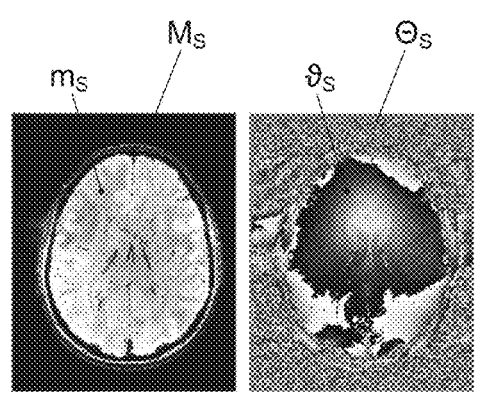

As the example of FIG. 4d shows, the combined phase image $\Theta_S$ is phase offset-compensated and yields phase values $\vartheta_S$ for each pixel which represent the respective volume element more reliably than the target phase values $\vartheta_{T,p}$ of a single target phase image $\Theta_{T,p}$; and the combined magnitude image $M_S$—whether calculated according to eq. 3 or eq. 4—shows a substantial increase in SNR as compared to any single target magnitude image $M_{T,p}$. Thereby, the structures in a patient's body are depicted in significantly more detail.

The invention is not limited to the embodiments described in detail above, but encompasses all variants and modifications thereof which will become apparent to the person skilled in the art from the present disclosure and which fall into the scope of the appended claims.

What is claimed is:

1. A method for Magnetic Resonance Imaging to depict a 3-dimensional object by an image having pixels representing volume elements of the object, comprising:

immobilising the object and acquiring a reference image of the object with a receiver coil at a first echo time immediately following an excitation by a transmitter coil, wherein said reference image is complex-valued, representing each volume element by a pixel with a reference magnitude value and a reference phase value;

keeping the object immobilised and acquiring a target image of the object with said receiver coil at a preselected second echo time, longer than said first echo time, following the same or another excitation by said transmitter coil, wherein said target image is complex-valued, representing each volume element by a pixel with a target magnitude value and a target phase value;

subtracting, pixel by pixel, the reference phase value from the target phase value to obtain a corrected phase value for each pixel; and obtaining said image from said target magnitude values and said corrected phase values, wherein the method is applied to each of a plurality of receiver coils arranged around said immobilised object to obtain a respective plurality of said images, followed by the step of calculating a combined phase image, pixel by pixel, according to $$\vartheta_S = \angle\left(\sum_p m_{T,p} \cdot e^{-i(\vartheta_{T,p} - \vartheta_{R,p})}\right)$$

with $\angle(\bullet)$ denoting the four-quadrant tangent inverse operator, $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{R,p}$ being the reference phase value of a pixel, representing said volume element, in a reference image acquired with the $p^{th}$ receiver coil, and $\vartheta_S$ being the phase value of a pixel, representing said volume element, in the combined phase image.

2. The method of claim 1, wherein said first echo time is less than 1 ms.

3. The method of claim 1, wherein said first echo time is less than 100 μs.

4. The method of claim 1, wherein the reference image is acquired at a lower pixel resolution than the target image and, prior to said subtracting, is upscaled to the pixel resolution of the target image.

5. The method of claim 1, wherein the respective reference or target images acquired with said plurality of receiver coils are all acquired following one and the same excitation.

6. The method of claim 1, wherein the method is applied to each of a plurality of receiver coils arranged around said immobilised object to obtain a respective plurality of said images, followed by the step of calculating a combined magnitude image, pixel by pixel, according to $$m_S = \left|\sum_p m_{T,p} \cdot e^{-i(\vartheta_{T,p} - \vartheta_{R,p})}\right|$$

with $|\bullet|$ denoting the magnitude operator, $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{R,p}$ being the reference phase value of a pixel, representing said volume element, in a reference image acquired with the $p^{th}$ receiver coil, and $m_S$ being the magnitude value of a pixel, representing said volume element, in the combined magnitude image.

7. The method of claim 1, wherein the method is applied to each of a plurality of receiver coils arranged around said immobilised object to obtain a respective plurality of said images, followed by the step of calculating a combined magnitude image, pixel by pixel, according to $$m_W = \sqrt{\left|\sum_p m_{T,p}^2 \cdot e^{-i(\vartheta_{T,p} - \vartheta_{R,p})}\right|}$$

with $|\bullet|$ denoting the magnitude operator, $m_{T,p}$ being the target magnitude value of a pixel, representing a volume element of the object, in a target image acquired with the $p^{th}$ receiver coil, $\vartheta_{T,p}$ being the target phase value of said pixel, $\vartheta_{T,p}$ being the reference phase value of a pixel, representing said volume element, in a reference image acquired with the $p^{th}$ receiver coil, and $m_W$ being the magnitude value of a pixel, representing said volume element, in the combined magnitude image.

8. A method for Magnetic Resonance Imaging to depict a 3-dimensional object by an image having pixels representing volume elements of the object, comprising:

immobilising the object and acquiring a reference image of the object with a receiver coil at a first echo time immediately following an excitation by a transmitter coil, wherein said reference image is complex-valued, representing each volume element by a pixel with a reference magnitude value and a reference phase value;

keeping the object immobilised and acquiring a target image of the object with said receiver coil at a preselected second echo time, longer than said first echo time, following the same or another excitation by said transmitter coil, wherein said target image is complex-valued, representing each volume element by a pixel with a target magnitude value and a target phase value;

subtracting, pixel by pixel, the reference phase value from the target phase value to obtain a corrected phase value for each pixel; and obtaining said image from said target magnitude values, and said corrected phase values, wherein the method is applied to each of a plurality of receiver coils arranged around said immobilised object to obtain a respective plurality of said images, followed by the step of calculating a combined magnitude image, pixel by pixel, according to $$m_S = \left|\sum_p m_{T,p} \cdot e^{-i(\vartheta_{T,p} - \vartheta_{R,p})}\right|$$

with
- |•| denoting the magnitude operator,
- $m_{T,p}$ being the target magnitude value of a pixel, representing a volume element of the object, in a target image acquired with the $p^{th}$ receiver coil,
- $\vartheta_{T,p}$ being the target phase value of said pixel,
- $\vartheta_{R,p}$ being the reference phase value of a pixel, representing said volume element, in a reference image acquired with the $p^{th}$ receiver coil, and
- $m_S$ being the magnitude value of a pixel, representing said volume element, in the combined magnitude image.

9. The method of claim 8, wherein the respective reference or target images acquired with said plurality of receiver coils are all acquired following one and the same excitation.

10. The method of claim 8, wherein said first echo time is less than 1 ms.

11. The method of claim 8, wherein said first echo time is less than 100 μs.

12. The method of claim 8, wherein the reference image is acquired at a lower pixel resolution than the target image and, prior to said subtracting, is upscaled to the pixel resolution of the target image.

13. A method for Magnetic Resonance Imaging to depict a 3-dimensional object by an image having pixels representing volume elements of the object, comprising:
  immobilising the object and acquiring a reference image of the object with a receiver coil at a first echo time immediately following an excitation by a transmitter coil, wherein said reference image is complex-valued, representing each volume element by a pixel with a reference magnitude value and a reference phase value;
  keeping the object immobilised and acquiring a target image of the object with said receiver coil at a preselected second echo time, longer than said first echo time, following the same or another excitation by said transmitter coil, wherein said target image is complex-valued, representing each volume element by a pixel with a target magnitude value and a target phase value;
  subtracting, pixel by pixel, the reference phase value from the target phase value to obtain a corrected phase value for each pixel; and
  obtaining said image from said target magnitude values, and said corrected phase values, wherein the method is applied to each of a plurality of receiver coils arranged around said immobilised object to obtain a respective plurality of said images, followed by the step of calculating a combined magnitude image, pixel by pixel, according to $$m_W = \sqrt{\left| \sum_p m_{T,p}^2 \cdot e^{-i(\vartheta_{T,p} - \vartheta_{R,p})} \right|}$$

with
- |•| denoting the magnitude operator,
- $m_{T,p}$ being the target magnitude value of a pixel, representing a volume element of the object, in a target image acquired with the $p^{th}$ receiver coil,
- $\vartheta_{T,p}$ being the target phase value of said pixel,
- $\vartheta_{R,p}$ being the reference phase value of a pixel, representing said volume element, in a reference image acquired with the $p^{th}$ receiver coil, and
- $m_W$ being the magnitude value of a pixel, representing said volume element, in the combined magnitude image.

14. The method of claim 13, wherein the respective reference or target images acquired with said plurality of receiver coils are all acquired following one and the same excitation.

15. The method of claim 13, wherein said first echo time is less than 1 ms.

16. The method of claim 13, wherein said first echo time is less than 100 μs.

17. The method of claim 13, wherein the reference image is acquired at a lower pixel resolution than the target image and, prior to said subtracting, is upscaled to the pixel resolution of the target image.

* * * * *